(12) United States Patent
Hayashi

(10) Patent No.: US 11,169,005 B2
(45) Date of Patent: Nov. 9, 2021

(54) SENSOR SUBSTRATE FOR ELECTROMAGNETIC-INDUCTION TYPE POSITION SENSOR AND METHOD OF MANUFACTURING SENSOR SUBSTRATE

(71) Applicant: OKUMA Corporation, Aichi (JP)

(72) Inventor: Yasukazu Hayashi, Aichi (JP)

(73) Assignee: OKUMA CORPORATION, Aichi (JP)

(*) Notice: Subject to any disclaimer, the term of this patent is extended or adjusted under 35 U.S.C. 154(b) by 167 days.

(21) Appl. No.: 16/507,273

(22) Filed: Jul. 10, 2019

(65) Prior Publication Data
US 2020/0018620 A1 Jan. 16, 2020

(30) Foreign Application Priority Data
Jul. 10, 2018 (JP) .............. JP2018-130949

(51) Int. Cl.
*G01D 5/20* (2006.01)
*H05K 3/46* (2006.01)
*H05K 1/16* (2006.01)
*H05K 1/11* (2006.01)
*G01D 18/00* (2006.01)
(Continued)

(52) U.S. Cl.
CPC ............ *G01D 5/204* (2013.01); *G01D 18/00* (2013.01); *G01R 31/2829* (2013.01); *G01R 31/50* (2020.01); *H05K 1/11* (2013.01); *H05K 1/165* (2013.01); *H05K 3/46* (2013.01); *H05K 2201/09236* (2013.01); *H05K 2201/09245* (2013.01); *H05K 2201/09263* (2013.01); *H05K 2201/10151* (2013.01)

(58) Field of Classification Search
CPC ........ G01D 5/204; G01D 18/00; G01R 31/50; G01R 31/2829; H05K 3/46; H05K 1/165; H05K 1/11; H05K 2201/09236; H05K 2201/10151; H05K 2201/09263; H05K 2201/09245; H05K 3/4617; G01B 7/003
See application file for complete search history.

(56) References Cited

U.S. PATENT DOCUMENTS

| 10,629,371 B2 * | 4/2020 | Itoh ............... H01F 17/0013 |
| 2006/0001518 A1 * | 1/2006 | Hayashi ............ G01D 5/2046 336/200 |

(Continued)

FOREIGN PATENT DOCUMENTS

JP 2006017533 A 1/2006

*Primary Examiner* — Christopher P McAndrew
*Assistant Examiner* — Zannatul Ferdous
(74) *Attorney, Agent, or Firm* — Cantor Colburn LLP

(57) ABSTRACT

A sensor substrate includes a multi-layered substrate and a plurality of coils formed on the substrate, an upper-side coil includes a first sub coil including a plurality of conductor patterns connected in series with each other in the substrate, and a second sub coil including a plurality of conductor patterns connected in series with each other in the substrate, and in any of the even number of layers, the conductor pattern belonging to the first sub coil and the conductor pattern belonging to the second sub coil are aligned alternately in a planar direction, and one end of the first sub coil is connected to one terminal of a short land, while one end of the second sub coil is connected to the other terminal of the short land separated from the one terminal in the planar direction.

4 Claims, 1 Drawing Sheet

(51) Int. Cl.
*G01R 31/28* (2006.01)
*G01R 31/50* (2020.01)

(56) References Cited

U.S. PATENT DOCUMENTS

2008/0172202 A1* 7/2008 Nakazato ............. G01D 5/2073
702/151
2015/0015268 A1* 1/2015 Yeh ..................... G06F 3/04166
324/511

* cited by examiner

SENSOR SUBSTRATE FOR ELECTROMAGNETIC-INDUCTION TYPE POSITION SENSOR AND METHOD OF MANUFACTURING SENSOR SUBSTRATE

CROSS REFERENCE TO RELATED APPLICATION

This application claims priority to Japanese Patent Application No. 2018-130949 filed on Jul. 10, 2018, which is incorporated herein by reference in its entirety including the specification, claims, drawings, and abstract.

TECHNICAL FIELD

The present specification discloses a sensor substrate which is a sensor substrate used for an electromagnetic-induction type position sensor in which a plurality of coils which receive AC magnetic fluxes and outputs electromagnetic induction voltages whose phases of amplitude change are different from each other are formed on the substrate.

BACKGROUND

Conventionally, as an electromagnetic-induction type position sensor which detects a position of a member rotated or relatively moved linearly by an electromagnetic induction action, an electromagnetic-induction type position sensor as disclosed in JP2006-17533A is known. This position sensor includes AC magnetic flux generating means which generates AC magnetic fluxes in conjunction with movement of a position detection target, and a sensor part which receives the AC magnetic fluxes and outputs an induction voltage. The sensor part is a sensor substrate constituted by printing on the substrate a conductor pattern constituting a plurality of coils. This position sensor is excellent in environmental resistance against water, oil, and the like and moreover, is capable of position detection with high accuracy. Moreover, the conductor pattern constituting the coil can be made by using a printed-board manufacturing technique and the like and can be manufactured with existing facilities where manufacture is easy. Moreover, when the sensor part is the sensor substrate on which the conductor pattern is printed, since an amplification circuit and the like other than the sensor part can be mounted on the sensor substrate, there was a merit that a weak position-sensor signal can be amplified in a state not easily susceptible to exogenous noises caused by wiring and the like.

However, when a coil of the sensor part of the electromagnetic-induction type position sensor as in JP2006-17533A is manufactured by the printed-board manufacturing technique, in some cases a short-circuit failure can occur between two conductor patterns belonging to the same coil and adjacent in a planar direction due to defective etching or the like. Such two conductor patterns belonging to the same coil and adjacent in the planar direction are electrically conducted even if there is no short-circuit failure. Thus, by a general inspecting device for printed board which inspects only short circuit and opening between arbitrary terminals, identification of the aforementioned short-circuit failure has been difficult. Thus, inspection has been needed by an inspecting device which measures resistance values and inductances on both ends of the same coil. However, in the case of a short circuit in a section in which a resistance value between the patterns is very small or when a short-circuit resistance value is large, identification of a defective product has been difficult in measurement of the resistance values and inductances of the both ends of the same coil. If such a short-circuit failure which cannot be identified occurs in the measurement of the resistance values and inductances of the both ends of the same coil, a failure has been found in an operation inspection after circuit components are mounted on the printed board for sensor or in a final inspection after assembled as a sensor unit. Occurrence of such a failure causes a damage larger than a unit price of the printed board for sensor, and moreover, proving that it is a failure on the printed board side is difficult and thus, feedback to printed board manufacturers has also been difficult. Thus, assuming such a case that short-circuit failures by printed board manufacture occur in a large quantity in a lot, inspection has caused a greater risk in supply of the electromagnetic-induction type position sensor than a loss by the failures.

Thus, this specification discloses a sensor substrate for electromagnetic-induction type position sensor which can easily identify a short-circuit failure of a conductor pattern, as well as a method of manufacturing a sensor substrate.

SUMMARY

A sensor substrate disclosed in this specification is a sensor substrate used for an electromagnetic-induction type position sensor and includes a substrate having an even number of layers laminated with an insulating material interposed therebetween and a plurality of coils formed on the substrate and receiving AC magnetic fluxes and outputting electromagnetic induction voltages whose phases of amplitude change are different from each other, in which each coil includes a first sub coil formed in a number of one or more in each of the even number of layers and including a plurality of conductor patterns connected in series to each other in the substrate, and a second sub coil formed in a number of one or more in each of the even number of layers and including a plurality of conductor patterns connected in series to each other in the substrate, and in any of the even number of layers, the conductor pattern belonging to the first sub coil and the conductor pattern belonging to the second sub coil are aligned alternately in the planar direction, one end of the first sub coil is connected to a first terminal, and one end of the second sub coil is separated from the first terminal in the planar direction and is connected to a second terminal formed on the same layer as the first terminal.

In this case, the first terminal and the second terminal are electrically connected by a conductor other than the conductor printed on the substrate, and since the first terminal and the second terminal are electrically connected, the first sub coil and the second sub coil are connected in series and may form the coil.

A method of manufacturing a sensor substrate disclosed in this specification is a method of manufacturing a sensor substrate which is a sensor substrate used for an electromagnetic-induction type position sensor in which a plurality of coils which receive AC magnetic fluxes and output electromagnetic induction voltages whose phases of amplitude change are different from each other are formed on a substrate having an even number of layers laminated with an insulating material interposed therebetween, including a forming step of forming a plurality of the coils each having a first sub coil and a second sub coil electrically insulated from each other on the substrate, an inspection step of inspecting presence of a short circuit between the first sub coil and the second sub coil after the forming step, and a connecting step of electrically connecting the first sub coil and the second sub coil belonging to the same coil when it is determined by the inspecting step that there is no short circuit, in which the first sub coil includes a plurality of conductor patterns formed in a number of one or more in each of the even number of layers and connected in series to each other in the substrate, the second sub coil includes a plurality of conductor patterns formed in a number of one or more in each of the even number of layers and connected in series to each other in the substrate, in any of the even number of layers, the conductor pattern belonging to the first sub coil and the conductor pattern belonging to the second sub coil are aligned alternately in the planar direction, one end of the first sub coil is connected to a first terminal, one end of the second sub coil is separated from the first terminal in the planar direction and connected to a second terminal formed on the same layer as the first terminal, and in the connecting step, the first terminal and the second terminal are electrically connected.

In this case, in the inspecting step, presence of the short circuit may be determined by presence of electrical conduction between the first sub coil and the second sub coil.

In the substrate for sensor disclosed in this specification, since the adjacent conductor patterns are insulated at least immediately after fabrication of the conductor pattern, there is no electrical conduction. Thus, even if a short-circuit failure occurs between the adjacent conductor patterns, the short-circuit failure may be detected by a general inspecting device for printed boards or the like. As a result, the conductor pattern for sensor in which a short-circuit failure occurred may be prevented from flowing to a subsequent process. Moreover, the serial connection between the sub coils after the fabrication of the conductor patterns may be made by mounting of a conductor (such as a solder, a zero-ohm resistor, or the like) other than the conductor printed on the substrate, and thus, connection between the sub coils may be made easily in a circuit component mounting process and it may be realized in an existing manufacturing process without adding an excess manufacturing process. Moreover, an inspection process for measuring a resistance value or an inductance on both ends of the same coil which has been carried out conventionally is no longer needed, and a manufacturing cost can also be reduced.

BRIEF DESCRIPTION OF DRAWINGS

Embodiments of the present disclosure will be described based on the following figures, wherein.

DESCRIPTION OF EMBODIMENTS

Figure 1:
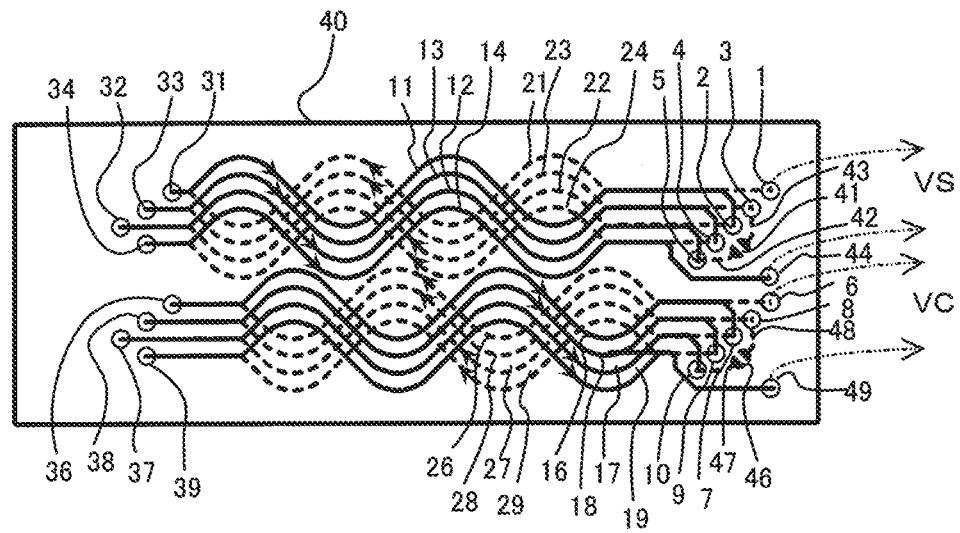
FIG. 1 is a view illustrating an example of a sensor substrate used for an electromagnetic-induction type position sensor.

FIG. 1 illustrates an example of a sensor substrate used for an electromagnetic-induction type position sensor. FIG. 1 illustrates a sensor substrate not in a completed state but in a manufacturing process.

The sensor substrate has a multi-layered printed board 40 having an even number of layers (two layers in this example) laminated with an insulating material interposed therebetween and a plurality of (two in this example) coils formed on the multi-layered printed board 40. The plurality of coils receive AC magnetic fluxes and output electromagnetic induction voltages whose phases of amplitude change are different from each other. In each layer of the multi-layered printed board 40, a coil is constituted and a sinusoidal conductor pattern is formed. In FIG. 1, a conductor pattern formed on a first layer (surface layer) of the multi-layered printed board 40 is indicated by a solid line and the conductor pattern formed on the second layer by a dotted line.

In the example in FIG. 1, the sensor substrate has an upper-side coil formed on an upper half of the multi-layered printed board 40, and a lower-side coil formed on a lower half of the multi-layered printed board 40. First, the constitution of the upper-side coil will be described. A through hole 1 is connected to a right end of a sinusoidal conductor pattern 21 on the second layer. A left end of the conductor pattern 21 is connected, via a through hole 31, to a left end of the sinusoid-shaped conductor pattern 11 having a reversed phase of the conductor pattern 21 on the second layer. The right end of the conductor pattern 11 is connected, via a through hole 2, to a sinusoid-shaped conductor pattern 22 having the same phase as the conductor pattern 21. The left end of the conductor pattern 22 is connected, via a through hole 32, to a sinusoid-shaped conductor pattern 12 having the same phase as the conductor pattern 11. The right end of the conductor pattern 12 is connected, via a through hole 5 and wiring 42, to one terminal (first terminal) of a short land 41 of two terminals on the second layer.

Moreover, the other terminal (second terminal) of the short land 41 is connected, via wiring 43 on the second layer and a through hole 3, to the right end of a sinusoid-shaped conductor pattern 23 having the same phase as the conductor pattern 21. The left end of the conductor pattern 23 is connected, via a through hole 33, to the left end of a sinusoid-shaped conductor pattern 13 having the same phase as the conductor pattern 11. The right end of the conductor pattern 13 is connected, via a through hole 4, to the right end of a sinusoid-shaped conductor pattern 24 having the same phase as the conductor pattern 21. The left end of the conductor pattern 24 is connected, via a through hole 34, to the left end of a sinusoid-shaped conductor pattern 14 having the same phase as the conductor pattern 11. The right end of the conductor pattern 14 is connected to a through hole 44.

As is obvious from the description above, the conductor patterns 21, 11, 22, and 12 are connected in series through the through holes 31, 2, and 32 and constitute a first sub coil. Moreover, the conductor patterns 23, 13, 24, and 14 are connected in series through the through holes 33, 4, and 34 and constitute a second sub coil. Moreover, one end of this first sub coil is connected to one terminal (first terminal) of the short land 41 through the through hole 5 and the wiring 42. One end of the second sub coil is connected to the other terminal (second terminal) of the short land 41 through the through hole 3 and the wiring 43. And the one terminal (first terminal) and the other terminal (second terminal) are formed on the same layer (second layer) and separated in the planar direction. As a result, unless the two terminals are connected by another conductor, the first sub coil and the second sub coil are insulated from each other.

Moreover, as is obvious from FIG. 1, the conductor pattern belonging to the first sub coil and the conductor pattern belonging to the second sub coil are aligned alternately in the planar direction. For example, by paying attention to the first layer, the conductor patterns 11 and 12 belonging to the first sub coil and the conductor patterns 13 and 14 belonging to the second sub coil are aligned alternately in the planar direction. Similarly, by paying attention to the second layer, the conductor patterns 21 and 22 belonging to the first sub coil and the conductor patterns 23 and 24 belonging to the second sub coil are aligned alternately in the planar direction.

The lower-side coil formed on the lower half of the multi-layered printed board 40 has a configuration substantially similar to that of the upper-side coil except that a phase of the conductor pattern in a transverse direction is shifted by 90 degrees from the conductor pattern on the upper-side coil. That is, similarly to the upper-side coil, the lower-side coil also has the first sub coil and the second sub coil. In the first sub coil, conductor patterns 26, 16, 27, and 17 are connected in series through through holes 36, 7, and 37, and in the second sub coil, conductor patterns 28, 18, 29, and 19 are connected in series through through holes 38, 9, and 39.

One end of the first sub coil is connected to one terminal (first terminal) of a short land 46 through a through hole 10 and wiring 47, and one end of the second sub coil is connected to the other terminal (second terminal) of the short land 46 through a through hole 8 and wiring 48. And the one terminal (first terminal) and the other terminal (second terminal) are formed on the same layer (second layer) and are separated in the planar direction. As a result, unless the two terminals are connected by another conductor, the first sub coil and the second sub coil are insulated from each other.

Moreover, as is obvious from FIG. 1, the conductor pattern belonging to the first sub coil and the conductor pattern belonging to the second sub coil are aligned alternately in the planar direction. For example, by paying attention to the first layer, the conductor patterns 16 and 17 belonging to the first sub coil and the conductor patterns 18 and 19 belonging to the second sub coil are aligned alternately in the planar direction. Similarly, by paying attention to the second layer, the conductor patterns 26 and 27 belonging to the first sub coil and the conductor patterns 28 and 29 belonging to the second sub coil are aligned alternately in the planar direction.

Although not shown, the through holes 1, 44 connected to the other ends of the first and second sub coils of the upper-side coil and 6 and 49 connected to the other ends of the first and second sub coils of the lower-side coil are connected to lands (not shown) for mounting different components for a sensor amplification circuit formed on the second layer of the multi-layered printed board 40, respectively. As a result, the four sub coils are connected in insulation from each other. Thus, the adjacent sinusoid-shaped conductor patterns 11 and 13, 13 and 12, 12 and 14, 14 and 16, 16 and 18, 18 and 17, 17 and 19, 21 and 23, 23 and 22, 22 and 24, 24 and 26, 26 and 28, 28 and 27, and 27 and 29 on the first layer and the second layer are connected so as not to have electrical conduction therebetween. Thus, in the case of a short-circuit failure between the adjacent conductor patterns, since there is electrical conduction between the two terminals of the short land 41 or the two terminals of the short land 46, a failure of the conductor pattern can be detected easily by a general inspecting device for printed boards.

Here, as described above, the sensor substrate in FIG. 1 is in the middle of manufacture. When the aforementioned first and second sub coils can be formed by the printed-board manufacturing technique, presence of a short circuit between the first sub coil and the second sub coil is inspected. If as a result of the inspection it is determined that there is no short circuit, the first sub coil and the second sub coil are electrically connected. More specifically, in the multi-layered printed board 40, a solder paste is applied on the lands to be mounted with the electronic components including the short lands 41 and 46 on the second layer after the inspection by the inspecting device for printed board or the like. Subsequently, an electronic component such as a sensor amplification circuit is mounted on the land, and soldering is performed by reflow. In this process, the two terminals of the short land 41 and the two terminals of the short land 46 are electrically connected by the solder which is a conductor separate from the conductor printed on the multi-layered printed board. As a result, the first sub coil and the second sub coil of the upper-side coil are connected in series and constitute one coil. Moreover, the first sub coil and the second sub coil of the lower-side coil are also connected in series and constitute one coil.

Figure 2:
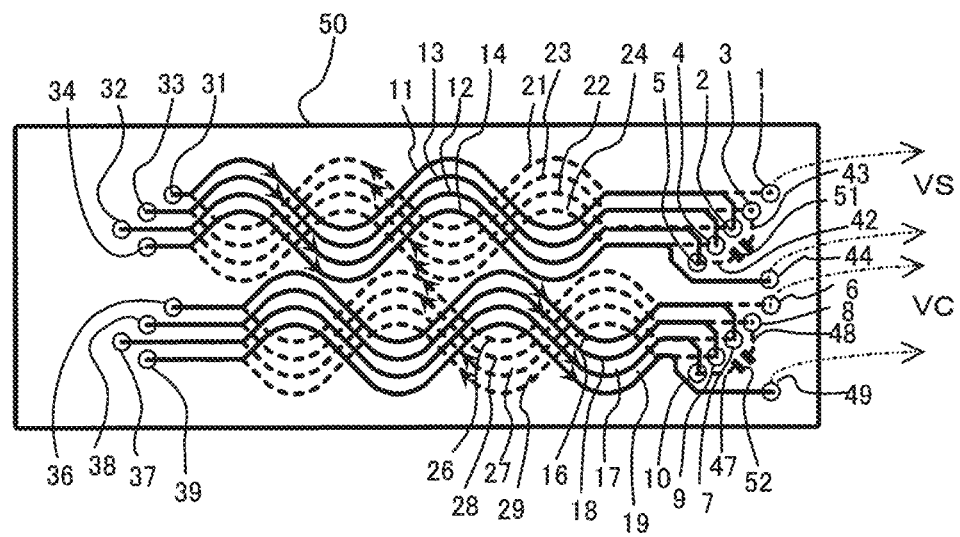
FIG. 2 is a view illustrating another example of the sensor substrate used for the electromagnetic-induction type position sensor.

Subsequently, another example of the sensor substrate used for an electromagnetic-induction type position sensor will be described by referring to FIG. 2. FIG. 2 is a view illustrating a configuration of a substrate for a sensor. In FIG. 2, those elements having the same functions as in FIG. 1 are assigned the same reference numerals, and repeated description will be omitted. In a multi-layered printed board 50 in FIG. 2, only the short lands 41 and 46 of the multi-layered printed board 40 in FIG. 1 are replaced with lands 51 and 52 for mounting chip resistor, and the other elements are completely the same. In the multi-layered printed board 50, a solder paste is applied on the lands to be mounted with the electronic components including the lands 51 and 52 for mounting chip resistor after the short-circuit inspection by the inspecting device for printed board or the like, and subsequently, electronic components such as a sensor amplification circuit and the like are mounted on the land, and soldering is performed by reflow. In this process, a chip resistor (not shown) with zero ohms is mounted on each of the lands 51 and 52 for a mounting chip resistor, and soldering is performed by reflow. As a result, the first sub coil and the second sub coil of the upper-side coil are connected in series and constitute one coil. Moreover, the first sub coil and the second sub coil of the lower-side coil are also connected in series and constitute one coil.

The configurations described so far are examples, and as long as the first and second sub coils insulated from each other and alternately aligned in the planar direction are formed on the printed board, and subsequently, the short-circuit inspection is conducted, and then the first and second sub coils are electrically connected, the other configurations may be configured as appropriate. For example, the multi-layered printed board with two-layer configuration is used in this example, but the multi-layered printed board may have more layers as long as the number of the layers is even. Moreover, the numbers of the conductor patterns constituting the first and second sub coils may be changed as appropriate. Moreover, a member for electrically connecting the first and second sub coils finally is not limited to the solder or the zero-ohm chip resistor, as long as it is a conductor other than the conductor printed on the substrate, and may be other members such as a gold wire bond, for example.

The invention claimed is:

1. A sensor substrate used for an electromagnetic-induction type position sensor, comprising:
   a substrate having an even number of layers laminated with an insulating material interposed therebetween; and
   a plurality of coils formed on the substrate and receiving AC magnetic fluxes and outputting electromagnetic induction voltages whose phases of amplitude change are different from each other, wherein
   each coil includes:

a first sub coil including a plurality of first conductor patterns; and a second sub coil including a plurality of second conductor patterns; and in each of the even number of layers, one or more of the first conductor patterns and one or more of the second conductor patterns are formed;

each of the plurality of first conductor patterns has a sinusoidal shape, the plurality of first conductor patterns being physically connected in series to each other such that the second conductor patterns do not electrically intervene between the first conductor patterns, in the substrate, each of the plurality of second conductor patterns has a sinusoidal shape, the plurality of second conductor patterns being physically connected in series to each other such that the first conductor patterns do not electrically intervene between the second conductor patterns, in the substrate, in any of the even number of layers, the first conductor patterns and the second conductor patterns are aligned alternately in an amplitude direction so that two of the second conductor patterns are located on opposite sides of the sinusoidal shape of one of the first conductor patterns as viewed in the amplitude direction, and two of the first conductor patterns are located on opposite sides of the sinusoidal shape of one of the second conductor patterns as viewed in the amplitude direction;

one end of the first sub coil is connected to a first terminal; and one end of the second sub coil is separated from the first terminal in the planar direction and is connected to a second terminal formed on the same layer as the first terminal.

2. The sensor substrate according to claim 1, wherein the first terminal and the second terminal are electrically connected by a conductor other than the conductor printed on the substrate; and since the first terminal and the second terminal are electrically connected, the first sub coil and the second sub coil are connected in series and constitute the coil.

3. A method of manufacturing a sensor substrate which is a sensor substrate used for an electromagnetic-induction type position sensor in which a plurality of coils which receive AC magnetic fluxes and output electromagnetic induction voltages whose phases of amplitude change are different from each other are formed on a substrate having an even number of layers laminated with an insulating material interposed therebetween, comprising the steps of:

forming on the substrate a plurality of the coils each having a first sub coil and a second sub coil electrically insulated from each other, inspecting presence of a short circuit between the first sub coil and the second sub coil after the forming step; and electrically connecting the first sub coil and the second sub coil belonging to the same coil when it is determined by the inspecting step that there is no short circuit, wherein the first sub coil includes a plurality of first conductor patterns;

the second sub coil includes a plurality of second conductor patterns;

in each of the even number of layers, one or more of the first conductor patterns and one or more of the second conductor patterns are formed;

each of the plurality of first conductor patterns has a sinusoidal shape, the plurality of first conductor patterns being physically connected in series to each other such that the second conductor patterns do not electrically intervene between the first conductor patterns, in the substrate, each of the plurality of second conductor patterns has a sinusoidal shape, the plurality of second conductor patterns being physically connected in series to each other such that the first conductor patterns do not electrically intervene between the second conductor patterns, in the substrate, in any of the even number of layers, the first conductor patterns and the second conductor patterns are aligned alternately in an amplitude direction so that two of the second conductor patterns are located on opposite sides of the sinusoidal shape of one of the first conductor patterns as viewed in the amplitude direction, and two of the first conductor patterns are located on opposite sides of the sinusoidal shape of one of the second conductor patterns as viewed in the amplitude direction;

one end of the first sub coil is connected to a first terminal;

one end of the second sub coil is separated from the first terminal in the planar direction and connected to a second terminal formed on the same layer as the first terminal; and in the connecting step, the first terminal and the second terminal are electrically connected.

4. The method of inspecting a sensor substrate according to claim 3, wherein in the inspecting step, presence of the short circuit is determined by presence of electrical conduction between the first sub coil and the second sub coil.

\* \* \* \* \*